United States Patent
Chen et al.

(10) Patent No.: US 6,492,214 B2
(45) Date of Patent: Dec. 10, 2002

(54) METHOD OF FABRICATING AN INSULATING LAYER

(75) Inventors: Chien-Wei Chen, Hsin-Chu (TW); Shin-Yi Tsai, Hsin-Chu (TW); Ming-Chung Liang, Ping-Tung (TW); Jiun-Ren Lai, Ping-Tung (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 09/683,649

(22) Filed: Jan. 29, 2002

(65) Prior Publication Data

US 2002/0168811 A1 Nov. 14, 2002

(30) Foreign Application Priority Data

May 11, 2001 (TW) .......................... 90111330 A

(51) Int. Cl.$^7$ ............................................ H01L 21/338
(52) U.S. Cl. ................ 438/183; 438/197; 438/152; 438/577
(58) Field of Search ................ 438/197, 152, 438/268, 527, 622, 303, 183

(56) References Cited

U.S. PATENT DOCUMENTS 6,051,470 A * 4/2000 An et al. .................. 438/163
6,319,807 B1 * 11/2001 Yeh et al. .................. 438/289

* cited by examiner

*Primary Examiner*—David Nelms
*Assistant Examiner*—Dung Anh Le
(74) *Attorney, Agent, or Firm*—Winston Hsu

(57) ABSTRACT

A method of fabricating an insulating layer starts by forming at least one gate, having at least a conductive layer and a cap oxide layer, on a surface of a semiconductor substrate. An insulating layer thicker than a height of the gate on the semiconductor substrate is then formed to follow the topography of the gate to produce an uneven surface. A planar layer is then formed on the insulating layer to form an approximately flat surface for the semiconductor substrate. By performing a planarization process, a portion of the planar layer is removed down to the surface of the insulating layer. A first etching process is then performed to completely remove the remaining portions of the planar layer. Finally, a second etching process is performed to remove the insulating layer and the cap oxide layer atop the gate, so that the remaining insulating layer outside the gate has a protrusive surface after the second etching process.

12 Claims, 6 Drawing Sheets

METHOD OF FABRICATING AN INSULATING LAYER

BACKGROUND OF INVENTION

1. Field of the Invention

The present invention relates to a method of fabricating an insulating layer, more specifically, to a method of fabricating an insulating layer used as a mask for forming a buried bit line.

2. Description of the Prior Art

An integrated circuit typically has thousands of metal oxide semiconductor (MOS) transistors. In order to prevent short-circuiting between adjacent MOS transistors, an insulation process is used to form a field oxide (FOX) layer or a shallow trench isolation (STI) structure between adjacent MOS transistors. However, as integrated circuits become more complex and more precise, process windows become smaller as well. Consequently, the local oxidation (LOCOS) process, employed to form a field oxide layer atop a buried bit line as isolation, is no longer practical in semiconductor processes with a line width less than 0.18 microns.

Please refer to FIG. 1 to FIG. 4. These figures are schematic views of forming an insulating layer 22 according to the prior art. As shown in FIG. 1, a conductive layer 12, a silicon nitride layer 14, an anti-reflection coating (ARC) 16 and a cap layer 18 are formed on a surface of a semiconductor substrate 10, respectively, to form a multi-layer structure. A photo and etching process (PEP) is then performed on the multi-layer structure to define and form at least one gate 20.

As shown in FIG. 2, a first ion implantation process, using the silicon nitride layer 14 as a mask of the gate 20, is performed to form a doped area, used as a buried bit line 21, in portions of the silicon substrate adjacent to either side of the gate 20. Then, a low-pressure chemical vapor deposition (LPCVD) process, using tetra-ethyl-ortho-silicate (TEOS) as a reacting gas, is performed to form an insulating layer 22, composed of silicon oxide, thicker than a height of the gate 20 on the semiconductor substrate 10. As the LPCVD process is performed, the insulating layer 22 follows the topography of the gate 20 to produce an uneven surface. The uneven surface has an irregular profile due to a height difference of thousands of angstroms between the gate 20 and the semiconductor substrate 10. Thus, portions of the surface of the insulating layer 22 adjacent to either side of the gate 20 have a concave curve shape.

As shown in FIG. 3, a planarization process is then performed to remove portions of the cap layer 18, the ARC 16 and the insulating layer 22 atop the gate 20. The planarization process can be a chemical mechanical polishing (CMP) process or an etching back process, both of which use the silicon nitride layer 14 as a stop layer. Due to the planarization process, portions of the insulating layer 22 adjacent to either side of the gate 20 retain a concave curve surface shape.

As shown in FIG. 4, a wet etching process is performed to remove the silicon nitride layer 14 in the gate 20, exposing the surface of the conductive layer 12 in the gate 20. A second ion implantation process is performed to dope the conductive layer 12 so as to reduce the resistivity of the gate 20. The insulating layer 22 is used as a mask layer of the second implantation process to prevent a penetration of ions into the buried bit line 21, leading to a defective concentration distribution of dopants.

As shown in FIG. 4, a height "c" of the insulating layer 22 is greater than a height "d" of the gate 20, as the insulating layer 22 is used as the mask layer of the doping process employed to adjust $V_t$ of the gate 20. However, an effective height "a" of the mask layer, the insulating layer 22, is determined by a concave depth "b." Thus an irreducible concave depth "b" normally leads to a defective concentration distribution of dopants in the buried bit line 21 in the ion implantation process. Furthermore, the concave structure of the insulating layer 22 can cause cracking of the thin film layer (not shown), filled into the concave structure, in subsequent processes, leading to a decreased yield rate of the product.

SUMMARY OF INVENTION

It is therefore a primary object of the present invention to provide a method of fabricating an insulating layer with sufficient effective height so as to obtain the required concentration of dopants in a buried bit line.

It is another object of the present invention to provide a method of fabricating an insulating layer so as to prevent a concave structure leading to a cracking of a thin film layer atop the insulating layer.

According to the claimed invention, a semiconductor substrate has at least one gate, comprising at least a conductive layer and a cap oxide layer, and a bit line in portions of the semiconductor substrate adjacent to either side of the gate. An insulating layer thicker than a height of the gate on the semiconductor substrate is then formed to follow the topography of the gate to produce an uneven surface. A planar layer is then formed on the surface of the insulating layer to form an approximately flat surface for the semiconductor substrate. By performing a planarization process, a portion of the planar layer is removed down to the surface of the insulating layer. A first etching process is then performed to completely remove the remaining portions of the planar layer. Finally, a second etching process is performed to remove the insulating layer and the cap oxide layer atop the gate, so that the remaining insulating layer outside the gate has a protrusive surface after the second etching process.

It is an advantage of the present invention that a planar layer and an etching process with a predetermined selectivity are employed to remove portions of the insulating layer. The insufficient effective height of the remaining portions of insulating layer adjacent to either side of the gate is thus prevented. Consequently, the insulating layer can be a mask layer with a sufficient effective height in the subsequent implantation processes employed to adjust either a resistivity or a threshold voltage of the gate, so as to obtain the required concentration of dopants in the bit lines. Additionally, the insulating layer formed in the present invention has a protrusive surface after the second etching process. The concave structure of the insulating layer, which leads to cracking of the thin film layer in subsequent processes, is thus prevented.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
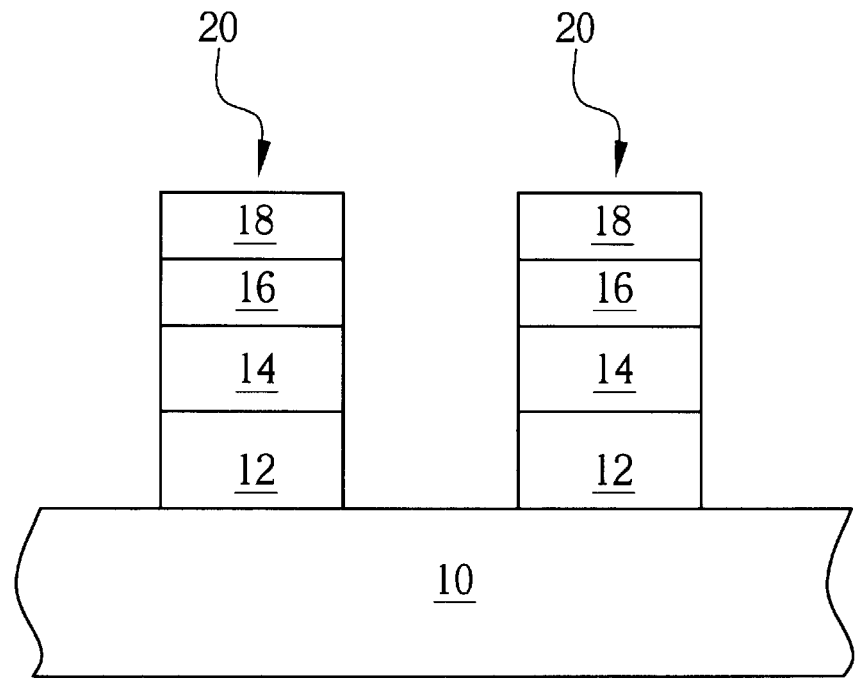
FIG. 1 to FIG. 4 are schematic views of forming an insulating layer according to the prior art.
Figure 2:
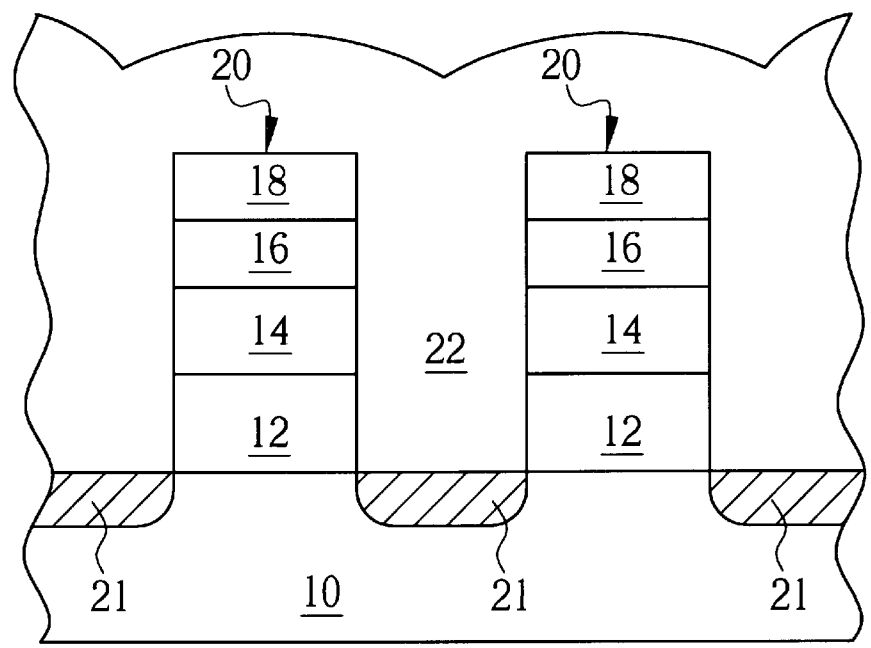
Figure 3:
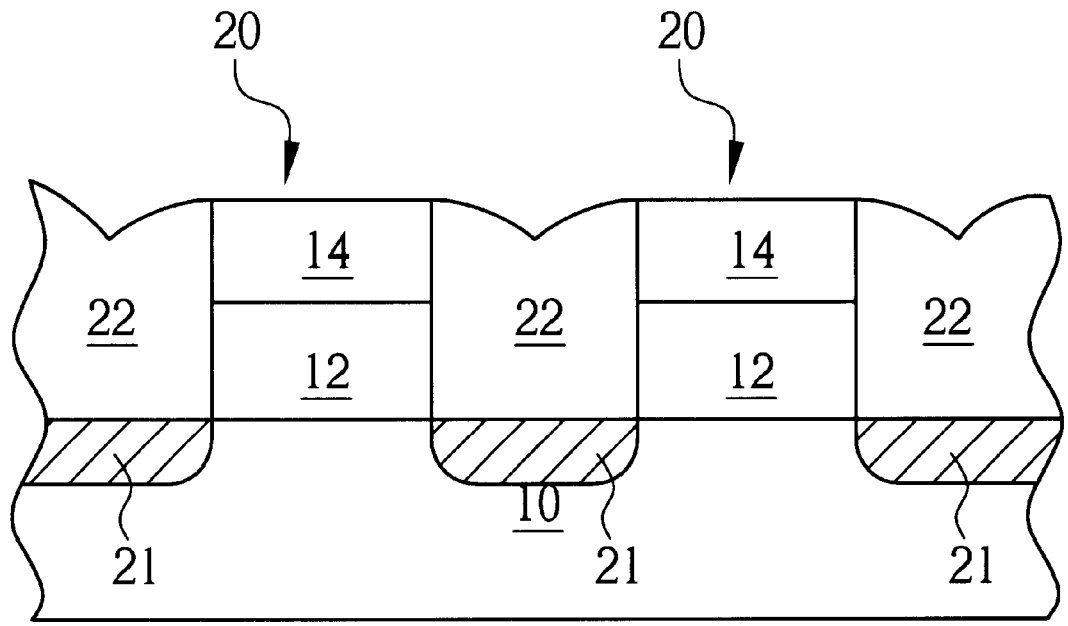
Figure 4:
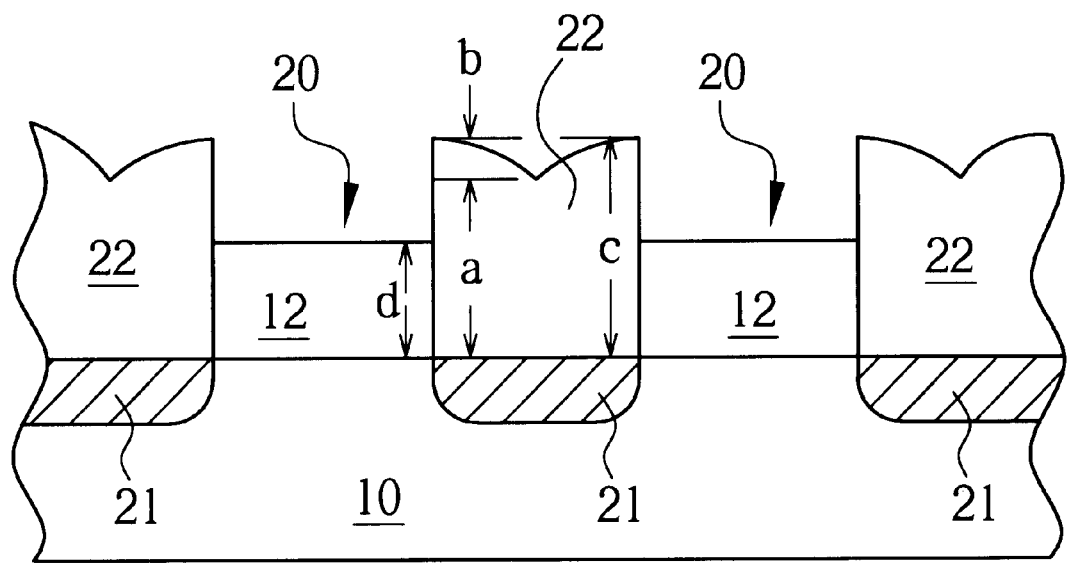
Figure 5:
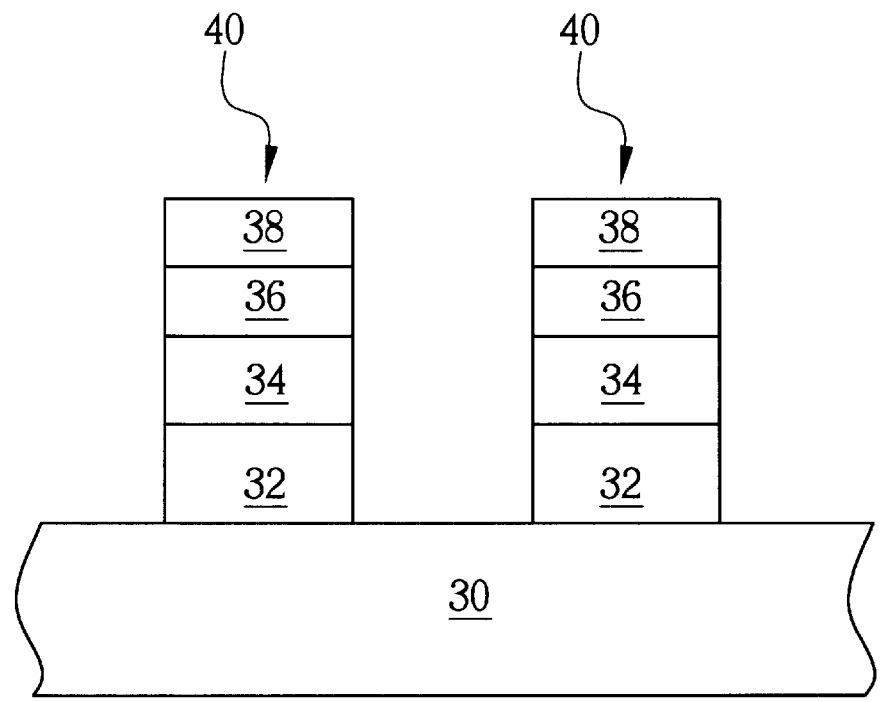
FIG. 5 to FIG. 11 are schematic views of forming an insulating layer according to the present invention.

Please refer to FIG. 5 to FIG. 11. These figures are schematic views of forming an insulating layer 42 according to the present invention. As shown in FIG. 5, a conductive layer 32, a silicon nitride layer 34, an anti-reflection coating (ARC) 36 and a cap layer 38 are formed on a surface of a semiconductor substrate 30, respectively, to form a multi-layer structure. In the preferred embodiment of the present invention, the ARC 36 is composed of silicon oxynitride (SiON), and the cap layer 38 is composed of silicon oxide. A photo and etching process (PEP) is then performed on the multi-layer structure to define and form at least one gate 40.

Figure 6:
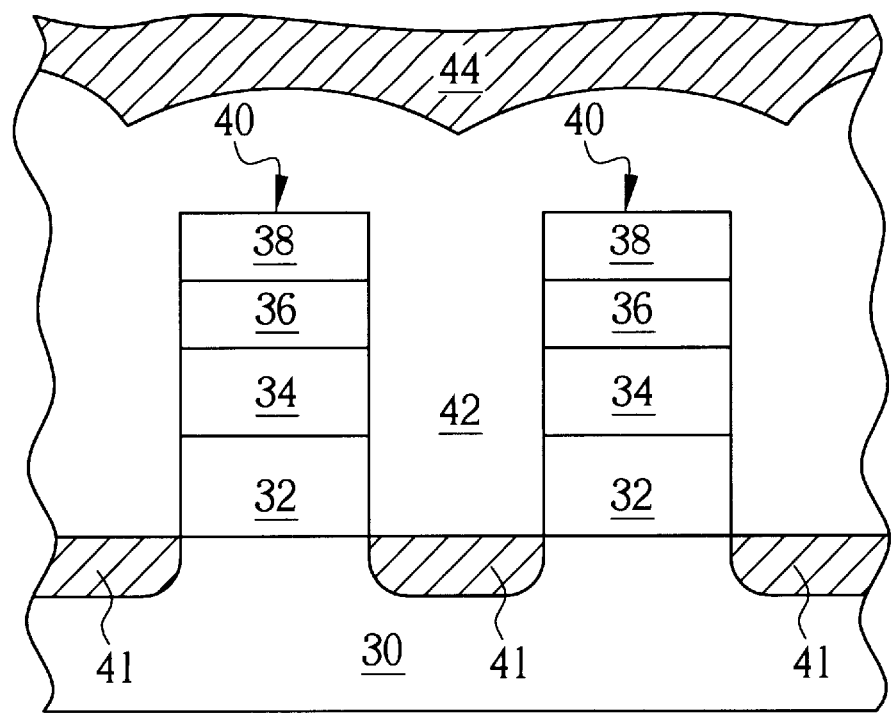

As shown in FIG. 6, a first implantation process, using the cap layer 38 as a mask of the gate 40, is performed to form a doped area, used as a buried bit line 41, in portions of the semiconductor substrate 30 adjacent to either side of the gate 40. Then, a low-pressure chemical vapor deposition (LPCVD) process, using tetra-ethyl-ortho-silicate (TEOS) as a reacting gas, is performed to form an insulating layer 42 composed of silicon oxide thicker than a height of the gate 40 on the semiconductor substrate 30. As the LPCVD process is performed, the insulating layer 42 follows the topography of the gate 40 to produce an uneven surface with an irregular profile due to a height difference of thousands of angstroms between the gate 40 and the semiconductor substrate 30. Thus portions of the surface of the insulating layer 42 adjacent to either side of the gate 40 are shaped as concave curves. A planar layer 44, optionally a dielectric layer, such as ACCUFLO produced by Allied signal Company, with excellent gap filling capability formed by a spin coating process of an organic polymer, is formed on the insulating layer 42 to form an approximately flat surface for the semiconductor substrate 30. Therefore, disadvantages in subsequent processes caused by the concave structure of the insulating layer 42 are prevented.

Figure 7:
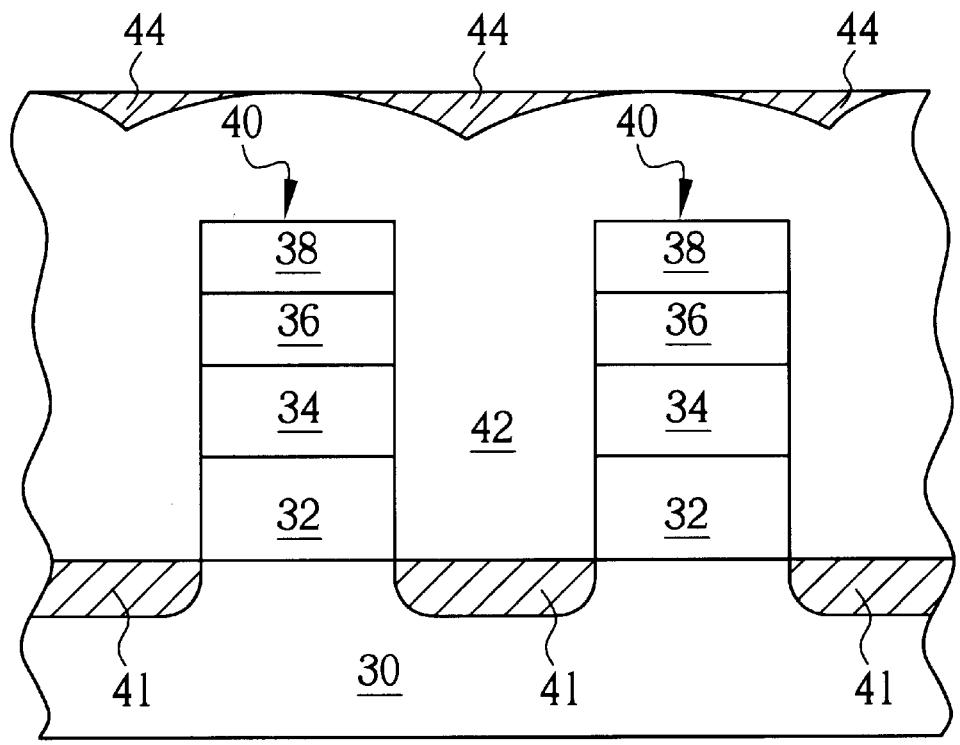

As shown in FIG. 7, a planarization process, an etching back process having an etching rate selectivity of the planar layer 44 to the insulating layer 42 of less than 1, is performed to remove portions of the planar layer 44 atop the gate 40 down to the surface of the insulating layer 42 atop the gate 40. The protrusive portions of the insulating layer 42 and the remaining portions of the planar layer 44 form an approximately flat surface on the semiconductor substrate 30.

Figure 8:
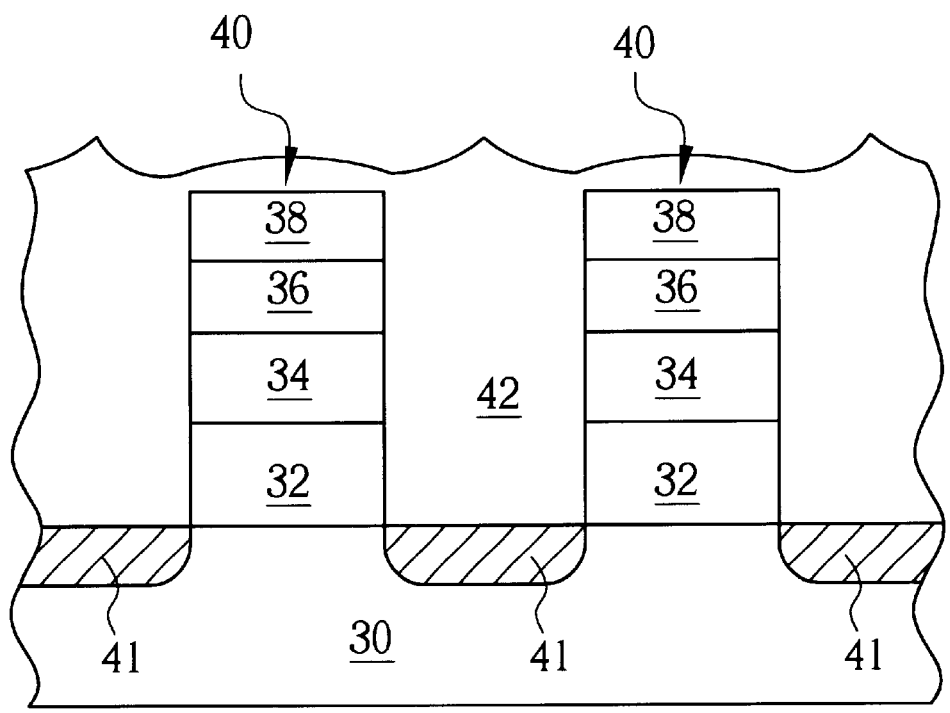

As shown in FIG. 8, a first etching process is performed to over etch both the insulating layer 42 and the planar layer 44 so as to remove the planar layer 44. This results in the remaining insulating layer 42 on either side of the gate 40 being higher than the remaining insulating layer 42 atop the gate 40. In other words, after the first etching process, the remaining portions of the insulating layer 42 have an irregular profile comprising a higher protrusive surface of portions of the insulating layer 42 adjacent to either side of the gate 40 and a lower flat surface of portions of the insulating layer 42 atop the gate 40.

Figure 9:
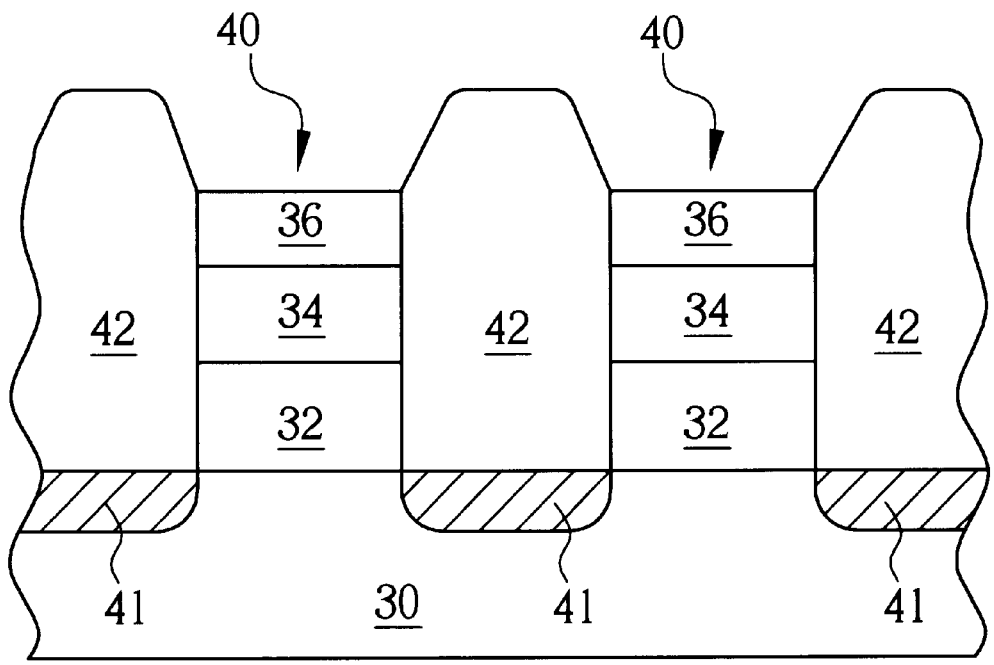

As shown in FIG. 9, a second etching process, having etching rate selectivities of the insulating layer 42 to both the ARC 36 and the silicon nitride layer 34 of greater than about 1, is then performed under an environment with proper argon (Ar) supply to remove the insulating layer 42 and the cap layer 38 atop the gate down to the surface of the ARC 36 and simultaneously planarize the protrusive structure on the surface of the insulating layer 42.

Figure 10:
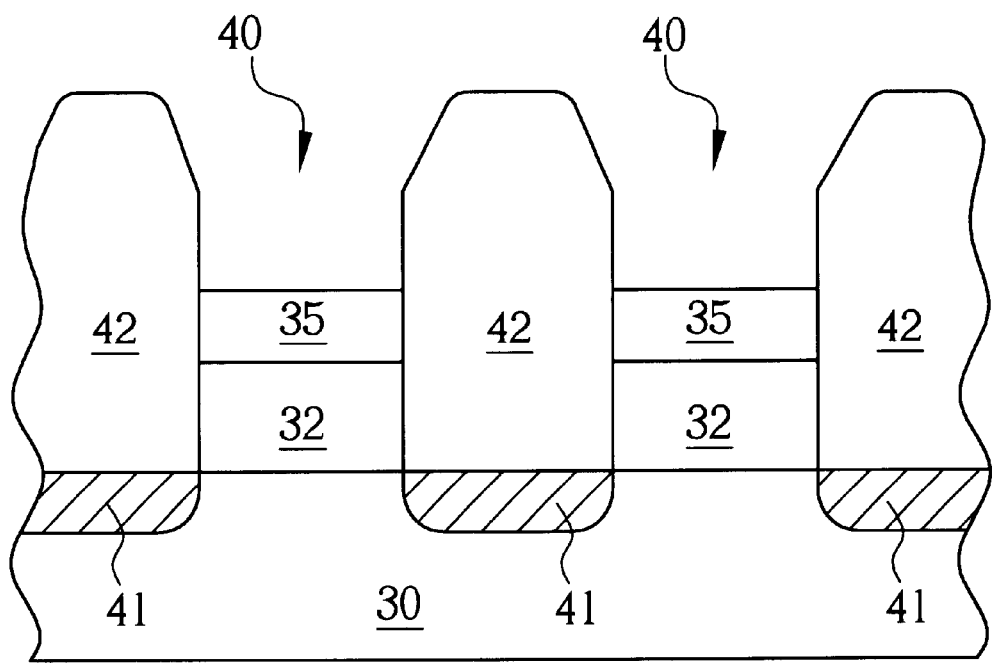

As shown in FIG. 10, a third etching process, having etching rate selectivities of the insulating layer 42 to both the ARC 36 and the silicon nitride layer 34 of less than about 1, is performed to remove the ARC 36 and portions of the silicon nitride layer 34 so as to expose the surface of a silicon nitride layer 35.

Figure 11:
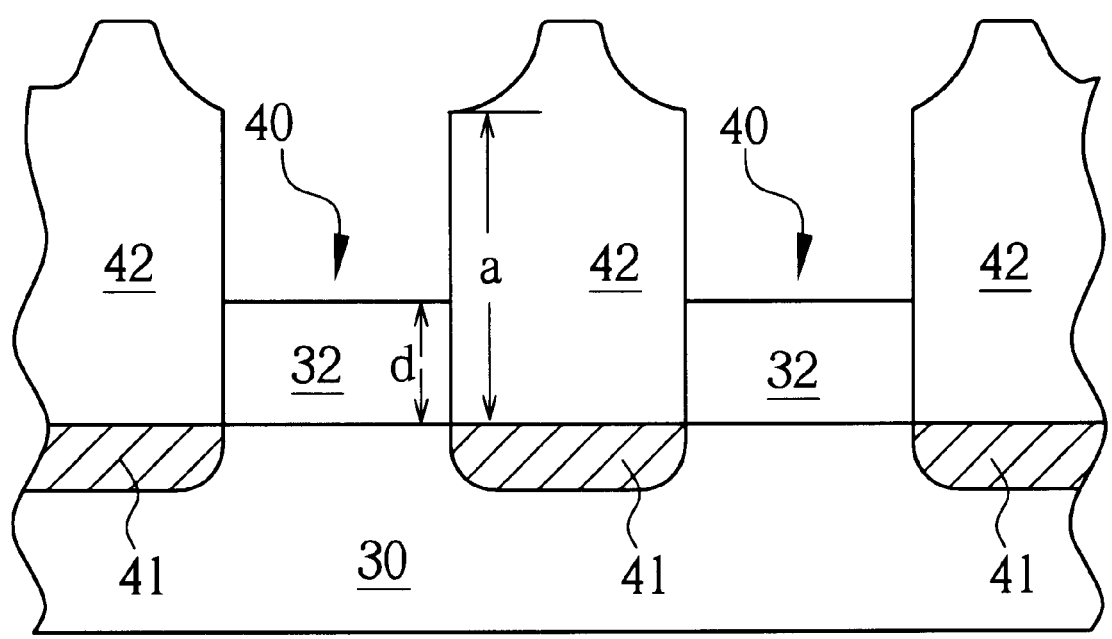

As shown in FIG. 11, a fourth etching process, using hot phosphoric acid as an etching solution, is performed to completely remove the silicon nitride layer 35. The remaining portions of the insulation layer 42 adjacent to either side of the gate 40 still have a protrusive profile after the third etching process is performed. In the preferred embodiment of the present invention, the effective height a of the insulating layer 42 ranges from 1200 to 1800 angstroms, and the conductive layer 32 has a height "d" ranging from 600 to 1000 angstroms. Finally, a second ion implantation process is performed to dope the conductive layer 32 so as to reduce the resistivity of the gate 40 as well as to adjust the threshold voltage of the gate 40. The insulating layer 42 atop the buried bit line 41 is used as a mask layer of the second ion implantation process so as to prevent a penetration of ions into the buried bit line 41, leading to a defective concentration distribution of dopants.

The method of the present invention starts by forming a planar layer 44 on the surface of the insulating layer 44 to prevent the height difference between the gate 40 and the semiconductor substrate 30 leading to the formation of a concave profile in the subsequent thin film deposition process. Then, etching processes with predetermined selectivities are performed to remove the cap layer 38, the ARC 36 and the silicon nitride 34, respectively, atop the gate 40 down to the surface of the conductive layer 32, so as to lead to the remaining portions of the insulating layer 42 having a protrusive profile adjacent to either side of the gate 40. Therefore, the insulating layer 42 with a sufficient effective height is obtained to be the mask layer of the ion implantation process employed to form the required concentration distribution of the dopants in both the gate 40 and the buried bit line 41.

In comparison with the prior art, the present invention provides a method of forming an insulating layer by performing a thin film deposition process and etching processes with predetermined selectivities. The insufficient effective height of the remaining portions of insulating layer adjacent to either side of the gate is thus prevented. Consequently, the required electrical property of the device is attained by the accurate concentrations of the dopants in the buried bit line. Furthermore, the insulating layer formed in the present invention has a protrusive surface. The concave structure, leading to the cracking of the thin film layer in subsequent processes of the insulating layer is thus prevented. The yield rate of the production is consequently increased.

Those skilled in the art will readily observe that numerous modifications and alterations of the method may be made while retaining the teachings of the invention. Accordingly, the above disclosure should be construed as limited only by the metes and bound of the appended claims.

What is claimed is:

1. A method of fabricating an insulating layer, the method comprising:

providing a semiconductor substrate;

forming at least one gate on the semiconductor substrate, the gate comprising at least a conductive layer and a cap oxide layer, respectively, on the semiconductor substrate;

forming an insulating layer thicker than a height of the gate on the semiconductor substrate, the insulating layer following the topography of the gate to produce an uneven surface;

forming a planar layer on the insulating layer to form an approximately flat surface for the semiconductor substrate;

performing a planarization process to remove a portion of the planar layer down to the surface of the insulating layer;

performing a first etching process to remove the planar layer; and performing a second etching process to remove the insulating layer and the cap oxide layer atop the gate, the remaining insulating layer outside the gate having a protrusive surface after the second etching process.

2. The method of claim 1 wherein a height of the insulating layer is approximately 1200 to 1800 angstroms (Å).

3. The method of claim 1 wherein a buried bit line is positioned in portions of the semiconductor substrate adjacent to either side of the gate.

4. The method of claim 1 wherein the gate further comprises an anti-reflection coating (ARC) and a silicon nitride layer positioned between the cap oxide layer and the conductive layer.

5. The method of claim 1 wherein an ion implantation process is performed to adjust either a resistivity of the conductive layer or a threshold voltage of the gate after the second etching process is performed.

6. The method of claim 5 wherein the ion implantation process uses the insulating layer as a mask so as to prevent ion penetration into portions of the semiconductor substrate adjacent to either side of the gate.

7. The method of claim 5 wherein between the second etching process and the ion implantation process, the method further comprises a third etching process to remove the anti-reflection coating and the silicon nitride layer down to the surface of the conductive layer.

8. The method of claim 1 wherein the insulating layer comprises tetra-ethyl-ortho-silicate (TEOS).

9. The method of claim 1 wherein the planar layer is formed by performing a spin-on organic polymer process.

10. The method of claim 1 wherein the planarization process is an etching back process.

11. The method of claim 8 wherein the etching back process has an etching rate selectivity of the planar layer to the insulating layer of less than about 1.

12. The method of claim 1 wherein the first etching process has an etching rate selectivity of the planar layer to the insulating layer of less than about 1, resulting in the remaining insulating layer outside the gate being higher than the remaining insulating layer atop the gate.

* * * * *